(12) United States Patent
Katagiri (10) Patent No.: US 11,471,950 B2
(45) Date of Patent: Oct. 18, 2022

(54) COATED CUTTING TOOL (71) Applicant: TUNGALOY CORPORATION, Fukushima (JP)

(72) Inventor: Takao Katagiri, Iwaki (JP)

(73) Assignee: TUNGALOY CORPORATION, Fukushima (JP)

( * ) Notice: Subject to any disclaimer, the term of this patent is extended or adjusted under 35 U.S.C. 154(b) by 15 days.

(21) Appl. No.: 17/347,713

(22) Filed: Jun. 15, 2021

(65) Prior Publication Data
US 2022/0040768 A1 Feb. 10, 2022

(30) Foreign Application Priority Data
Aug. 7, 2020 (JP) .............................. JP2020-134827

(51) Int. Cl.
| | |
|---|---|
| *B23B 27/14* | (2006.01) |
| *C23C 14/06* | (2006.01) |
| *C23C 14/30* | (2006.01) |
| *C23C 14/32* | (2006.01) |
| *C23C 28/04* | (2006.01) |
| *B23C 5/16* | (2006.01) |
| *C23C 28/00* | (2006.01) |

(52) U.S. Cl.
CPC .............. *B23B 27/148* (2013.01); *B23C 5/16* (2013.01); *C23C 14/0641* (2013.01); *C23C 14/0664* (2013.01); *C23C 14/30* (2013.01); *C23C 14/32* (2013.01); *C23C 28/044* (2013.01); *C23C 28/42* (2013.01); *C23C 28/44* (2013.01); *B23B 2224/24* (2013.01); *B23B 2228/10* (2013.01)

(58) Field of Classification Search
CPC ... B23B 27/14; B23B 27/148; C23C 16/0641; C23C 16/0664
USPC ........................................ 428/697, 698, 699
See application file for complete search history.

(56) References Cited

U.S. PATENT DOCUMENTS

2014/0272391 A1* 9/2014 Kumar .................... C23C 28/42
428/457
2016/0017499 A1 1/2016 Kikuchi
2018/0117680 A1 5/2018 Tanaka

FOREIGN PATENT DOCUMENTS

| EP | 3130418 A1 | 2/2017 |
|---|---|---|
| JP | 06-136514 * | 5/1994 |

(Continued)

*Primary Examiner* — Archene A Turner
(74) *Attorney, Agent, or Firm* — Studebaker & Brackett PC (57) ABSTRACT

Provided is a coated cutting tool having improved wear resistance and fracture resistance and a long tool life. The coated cutting tool includes a substrate, and a coating layer formed on a surface of the substrate. The coating layer has a laminated structure in which a first layer and a second layer are alternately laminated for one or more layers. The first layer is a compound layer having a composition represented by $Ti(C_xN_{1-x})$. The second layer is a compound layer having a composition represented by $(Ti_yAl_{1-y})N$. The laminated structure includes first to third laminated structures in this order from a substrate side to a surface side of the coating layer. An average thickness per layer of each of the first layer and the second layer in the first to third laminated structures is in a specific range. An average thickness of the first to third laminated structures is in a specific range.

16 Claims, 1 Drawing Sheet

(56) References Cited

FOREIGN PATENT DOCUMENTS

| | | |
|---|---|---|
| JP | 5594575 B2 | 11/2011 |
| WO | 2014/136755 A1 | 9/2014 |
| WO | 2016/175166 A1 | 11/2016 |

* cited by examiner

COATED CUTTING TOOL

CROSS-REFERENCES TO RELATED APPLICATIONS

This application relates to and claims priority from Japanese Patent Application No. 2020-134827 on (Aug. 7, 2020), the entire disclosure of which is incorporated herein by reference.

BACKGROUND OF THE INVENTION

Field of the Invention

The present invention relates to a coated cutting tool.

Description of Related Art

In the related art, cutting tools made of cemented carbide or cubic boron nitride (cBN) sintered body have been widely used for cutting steel or the like. Among them, surface coated cutting tools containing one or two or more hard coating films such as a TiN layer and a TiAlN layer on a surface of a cemented carbide substrate are used for various processing due to high versatility thereof.

For example, WO 2014/136755 (PTL 1) proposes a layer represented by $(Al_aTi_bM_c)X$ (wherein M represents at least one element selected from the group consisting of Zr, Hf, V, Nb, Ta, Cr, Mo, W, Y, B, and Si, X represents at least one element selected from the group consisting of C, N, and O, a represents an atomic ratio of an Al element to a total amount of the Al element, a Ti element, and a M element, b represents an atomic ratio of the Ti element to the total amount of the Al element, the Ti element, and the M element, c represents an atomic ratio of the M element to the total amount of the Al element, the Ti element, and the M element, and a, b, and c satisfy $0.30 \leq a \leq 0.65$, $0.35 \leq b \leq 0.70$, $0 \leq c \leq 0.20$, and $a+b+c=1$) provided on a substrate, and by making an average grain size of the layer larger than 200 nm, wear resistance is improved as compared with that in the related art.

Further, Japanese Patent No. 5594575 (PTL 2) proposes a layer $(Al_{1-x}Ti_x)N$ [$0.40 \leq X \leq 0.65$ is satisfied] provided on a substrate. The layer is formed of an alternating laminated structure of a thin layer A formed of a granular structure of a composite nitride containing Al and Ti and a thin layer B formed of a columnar structure. An average crystal grain size of granular crystals forming the thin layer A is 30 nm or less, and an average grain size of columnar crystals forming the thin layer B is 50 nm to 500 nm. A cutting tool on which the coating layer is vapor-deposited is excellent in chipping resistance and wear resistance as compared with that in the related art.

Lathe processing of difficult-to-cut materials such as stainless steel in recent years has tended to increase in speed and feed, and as cutting conditions tend to be stricter than that in the related art, it is required to improve wear resistance and fracture resistance and extend a tool life. Since the layer of PTL 1 has a grain size of more than 200 nm as a whole, it is expected that while exhibiting excellent wear resistance, sudden fractures and chipping are likely to occur. The coated cutting tool of PTL 2 has columnar crystals forming the layer A and the granular crystals forming the layer B, which have the same composition, alternately laminated, and since the coated cutting tool has high interfacial consistency, the distortion is small and the hardness of the layer is not sufficient. As a result, it is difficult to extend the tool life due to insufficient wear resistance.

SUMMARY

The invention has been made in view of the above circumstances, and an object of the invention is to provide a coated cutting tool having improved wear resistance and fracture resistance and a long tool life.

The present inventor has conducted research on extending a tool life of a coated cutting tool, and has found that when the coated cutting tool has a specific configuration, it is possible to improve wear resistance and fracture resistance thereof, and as a result, the tool life of the coated cutting tool can be extended. Thus, the invention has been completed.

That is, the gist of the invention is as follows.

[1]

A coated cutting tool including: a substrate; and a coating layer formed on a surface of the substrate, in which the coating layer has a laminated structure in which a first layer and a second layer are alternately laminated for one or more layers, the first layer is a compound layer having a composition represented by the following formula (1):

$$Ti(C_xN_{1-x}) \quad (1)$$

(in the formula, x represents an atomic ratio of a C element to a total amount of the C element and an N element, and satisfies $0.02 \leq x \leq 0.30$), the second layer is a compound layer having a composition represented by the following formula (2):

$$(Ti_yAl_{1-y})N \quad (2)$$

(in the formula, y represents an atomic ratio of a Ti element to a total amount of the Ti element and an Al element, and satisfies $0.25 \leq y \leq 0.75$), the laminated structure includes a first laminated structure, a second laminated structure, and a third laminated structure in this order from a substrate side to a surface side of the coating layer, an average thickness per layer of each of the first layer and the second layer in the first laminated structure is more than 500 nm and 3000 nm or less, an average thickness per layer of each of the first layer and the second layer in the second laminated structure is more than 50 nm and 500 nm or less, an average thickness per layer of each of the first layer and the second layer in the third laminated structure is 5 nm or more and 50 nm or less, an average thickness of the first laminated structure is more than 1.0 μm and 6.0 μm or less, an average thickness of the second laminated structure is more than 0.1 μm and 2.0 μm or less, and an average thickness of the third laminated structure is 0.1 μm or more and 2.0 μm or less.

[2]

The coated cutting tool according to [1], in which at a position 300 nm from an interface between the substrate and the coating layer toward the surface side of the coating layer, an average grain size of crystal grains forming the coating layer is 50 nm or more and 500 nm or less, and at a position 100 nm from a surface opposite to the substrate in the third laminated structure toward the substrate side, an average grain size of the crystal grains forming the coating layer is 5 nm or more and less than 50 nm.

[3]

The coated cutting tool according to [1] or [2], in which the coating layer includes an upper layer on the surface opposite to the substrate in the third laminated structure, the upper layer is a single layer or a laminate of a compound containing at least one element selected from the group consisting of Ti, Zr, Hf, V, Nb, Ta, Cr, Mo, W, Al, Si, and Y and at least one element selected from the group consisting of C, N, O, and B (however, the compound having the composition represented by the formula (1) and the compound having the composition represented by the formula (2) are excluded), and an average thickness of the upper layer is 0.1 μm or more and 3.5 μm or less.

[4]

The coated cutting tool according to any one of [1] to [3], in which an average thickness of the entire coating layer is 4.0 μm or more and 12.0 μm or less.

[5]

The coated cutting tool according to any one of [1] to [4], in which the substrate is any one of cemented carbide, cermet, ceramics, or a cubic boron nitride sintered body.

Advantageous Effects of the Invention

According to the invention, it is possible to provide a coated cutting tool having improved wear resistance and fracture resistance and a long tool life.

DETAILED DESCRIPTION

Figure 1:
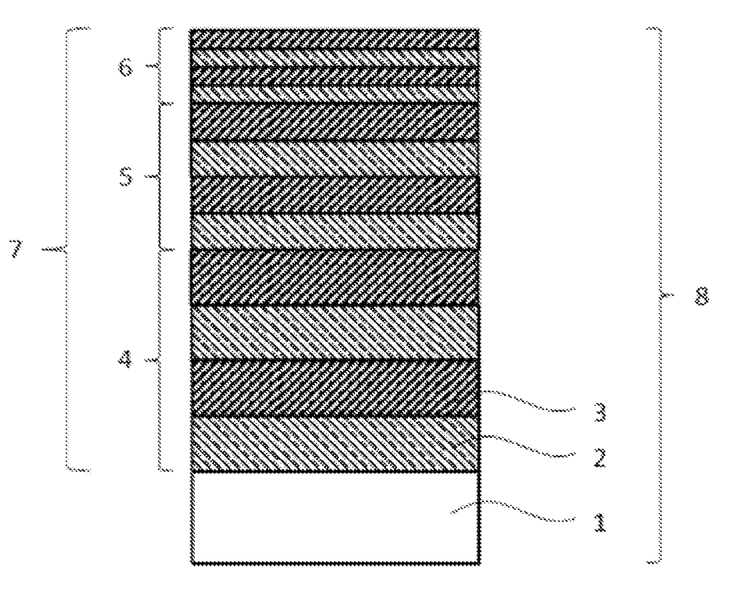
The FIGURE is a schematic view showing an example of a coated cutting tool of the invention.

Hereinafter, an embodiment for implementing the invention (hereinafter, simply referred to as "the present embodiment") will be described in detail, but the invention is not limited to the following embodiment. The invention can be modified in various ways without departing from the gist thereof. In the drawings, the same elements are designated by the same reference numerals, and repeated description will be omitted. Further, unless otherwise specified, a positional relationship such as up, down, left, and right is based on a positional relationship shown in the drawing. Furthermore, a dimensional ratio in the drawing is not limited to a ratio shown.

A coated cutting tool of the present embodiment includes a substrate and a coating layer formed on a surface of the substrate. The coating layer has a laminated structure in which a first layer and a second layer are alternately laminated for one or more layers.

The first layer is a compound layer having a composition represented by the following formula (1):

$$Ti(C_xN_{1-x}) \quad (1)$$

(in the formula, x represents an atomic ratio of a C element to a total amount of the C element and an N element, and satisfies 0.02≤x≤0.30).

The second layer is a compound layer having a composition represented by the following formula (2):

$$(Ti_yAl_{1-y})N \quad (2)$$

(in the formula, y represents an atomic ratio of a Ti element to a total amount of the Ti element and an Al element, and satisfies 0.25≤y≤0.75).

The laminated structure includes a first laminated structure, a second laminated structure, and a third laminated structure in this order from a substrate side to a surface side of the coating layer, an average thickness per layer of each of the first layer and the second layer in the first laminated structure is more than 500 nm and 3000 nm or less, an average thickness per layer of each of the first layer and the second layer in the second laminated structure is more than 50 nm and 500 nm or less, an average thickness per layer of each of the first layer and the second layer in the third laminated structure is 5 nm or more and 50 nm or less, an average thickness of the first laminated structure is more than 1.0 μm and 6.0 μm or less, an average thickness of the second laminated structure is more than 0.1 μm and 2.0 μm or less, and an average thickness of the third laminated structure is 0.1 μm or more and 2.0 μm or less.

Factors why such a coated cutting tool has improved wear resistance and fracture resistance and a long tool life are not clear in detail, but the present inventor considers the factors as follows. However, the factors are not limited thereto. That is, in the first layer forming the coating layer, when x in Ti($C_xN_{1-x}$) is 0.02 or more, the hardness increases, so that the wear resistance of the coated cutting tool is improved; in addition, with grain refinement, a compressive stress is easily applied and growth of cracks is prevented, so that the fracture resistance of the coated cutting tool is improved. Further, when x in Ti($C_xN_{1-x}$) is 0.30 or less, adhesion to the second layer is excellent, so that the fracture due to peeling is prevented. Further, in the second layer forming the coating layer, when y in ($Ti_yAl_{1-y}$)N is 0.25 or more, the effect of containing Ti is that the wear resistance of the coated cutting tool is improved by preventing a high temperature strength and the formation of hexagonal crystals. Further, when y in ($Ti_yAl_{1-y}$)N is 0.75 or less, heat resistance is improved, and therefore, reaction wear can be prevented even in processing with a high cutting temperature such as high-speed processing or high-load processing. As a result, the wear resistance of the coated cutting tool is improved. Further, when the coated cutting tool of the present embodiment has a laminated structure in which the first layer and the second layer are alternately laminated for one or more layers in the coating layer, interfacial consistency is low, so that the hardness is increased, and as a result, the wear resistance is improved. Further, when the coated cutting tool of the present embodiment has the laminated structure in which the first layer and the second layer are alternately laminated for one or more layers in the coating layer, the adhesion between the layers is also improved, and therefore the fracture due to the lack of peeling resistance can be prevented. Further, in the coated cutting tool of the present embodiment, since the laminated structure includes the first laminated structure, the second laminated structure, and the third laminated structure, in which the average thickness (hereinafter referred to as a "lamination period") per layer of each of the first layer and the second layer is controlled within a specific range, in this order from the substrate side toward the surface side of the coating layer, the adhesion between the layers can be improved and the fracture due to peeling is prevented. As a result, the wear resistance and the fracture resistance of the coated cutting tool of the present embodiment can be simultaneously improved, for example, in lathe processing of difficult-to-cut materials. Specifically, in the coated cutting tool of the present embodiment, a lamination period in the first laminated structure on the substrate side is set to more than 500 nm and 3000 nm or less, a lamination period in the third laminated structure on the surface side of the coating layer is set to 5 nm or more and 50 nm or less, and a lamination period in the second laminated structure between the first laminated structure and the third laminated structure is set to more than 50 nm and 500 nm or less. The laminated structure is such a structure, that is, a structure in which the lamination period is gradually reduced from the substrate side toward the surface side of the coating layer, so that the adhesion between the layers is excellent, and the fracture due to the lack of peeling resistance can be prevented. It is presumed that the reason why the adhesion between the layers is improved is that the increase in the compressive stress of the entire coating layer can be prevented. When the lamination period in the first laminated structure is more than 500 nm, by increasing the average grain size of the crystal grains contained in the first laminated structure, the adhesion is improved, and therefore, the fracture due to peeling can be prevented. On the other hand, when the lamination period in the first laminated structure is 3000 nm or less, the occurrence of cracks due to the increase in the compressive stress can be prevented by increasing the average thickness of the first layer and the second layer, so that the fracture resistance of the coated cutting tool is improved. In addition, when the lamination period in the second laminated structure is more than 50 nm, the adhesion between the first laminated structure and the second laminated structure is improved. It is presumed that this is because the balance between the average grain size of the crystal grains contained in the first laminated structure and the second laminated structure and the compressive stress is excellent. On the other hand, when the lamination period in the second laminated structure is 500 nm or less, the adhesion between the second laminated structure and the third laminated structure is improved. It is presumed that this is because the balance between the average grain size of the crystal grains contained in the second laminated structure and the third laminated structure and the compressive stress is excellent. Further, when the lamination period in the third laminated structure is 5 nm or more, cracks generated during processing can be prevented from growing toward the substrate, so that the fracture resistance of the coated cutting tool is improved. In addition, it is presumed that by chipping only the surface side of the coating layer, the coating layer on the substrate side remains, and as a result, the wear resistance of the coated cutting tool is improved. On the other hand, when the lamination period in the third laminated structure is 50 nm or less, by reducing the average grain size of the crystal grains contained in the third laminated structure, the increase in the compressive stress on the surface side of the coating layer can be prevented, and therefore, the occurrence of cracks is prevented and the fracture resistance of the coated cutting tool is improved. Further, when the average thickness of the first laminated structure is more than 1.0 μm, the effect of having the first laminated structure can be obtained, and when the average thickness of the first laminated structure is 6.0 μm or less, it is possible to prevent a decrease in the fracture resistance due to a relative decrease in the thickness of the second laminated structure or the third laminated structure. Further, when the average thickness of the second laminated structure is more than 0.1 μm, the effect of having the second laminated structure can be obtained, and when the average thickness of the second laminated structure is 2.0 μm or less, it is possible to prevent a decrease in the adhesion and a decrease in the fracture resistance due to a relative decrease in the thickness of the first laminated structure or the third laminated structure. Further, when the average thickness of the third laminated structure is 0.1 μm or more, the effect of having the third laminated structure can be obtained, and when the average thickness of the third laminated structure is 2.0 μm or less, it is possible to prevent a decrease in the adhesion due to a relative decrease in the thickness of the first laminated structure or the second laminated structure. Combined with these effects, the coated cutting tool of the present embodiment has improved wear resistance and fracture resistance and a long tool life.

The coated cutting tool of the present embodiment includes a substrate and a coating layer formed on a surface of the substrate. The substrate used in the present embodiment is not particularly limited as long as the substrate can be used as a substrate for a coated cutting tool. Examples of the substrate include cemented carbide, cermet, ceramics, a cubic boron nitride sintered body, a diamond sintered body, and high speed steel. Among them, it is more preferable that the substrate is one or more selected from the group consisting of cemented carbide, cermet, ceramics, and a cubic boron nitride sintered body, because the fracture resistance of the coated cutting tool is more excellent.

In the coated cutting tool of the present embodiment, the average thickness of the entire coating layer is preferably 4.0 μm or more and 12.0 μm or less. In the coated cutting tool of the present embodiment, when the average thickness of the entire coating layer is 4.0 μm or more, the wear resistance tends to be improved. In the related art, when an atomic ratio of C in a TiCN layer is increased, the compressive stress increases and the adhesion decreases, and therefore, it is usually difficult to thicken the coating layer. In the coated cutting tool of the present embodiment, by alternately laminating the first layer and the second layer, the increase in the compressive stress can be prevented, and even if the average thickness of the entire coating layer is increased, the wear resistance can be further improved without lowering the adhesion. Further, in the coated cutting tool of the present embodiment, when the average thickness of the entire coating layer is 12.0 μm or less, the fracture resistance tends to be improved mainly due to the prevention of the peeling of the coating layer. In particular, in stainless steel processing, a work material is likely to be welded to the coated cutting tool, and then crimping separation damage due to separation is likely to occur. In order to further prevent the damage, the average thickness of the entire coating layer is more preferably 10.0 μm or less. Among them, from the same viewpoint as above, the average thickness of the entire coating layer is more preferably 4.5 μm or more and 9.0 μm or less, and particularly preferably 4.8 μm or more and 8.8 μm or less.

[First Layer]

In the coated cutting tool of the present embodiment, the first layer is a compound layer having a composition represented by the following formula (1).

$$\text{Ti}(C_xN_{1-x}) \tag{1}$$

(in the formula, x represents an atomic ratio of a C element to a total amount of the C element and an N element, and satisfies $0.02 \le x \le 0.30$).

In the first layer forming the coating layer, when x in $\text{Ti}(C_xN_{1-x})$ is 0.02 or more, the hardness increases, so that the wear resistance of the coated cutting tool is improved; in addition, with grain refinement, the compressive stress is easily applied and growth of cracks is prevented, so that the fracture resistance of the coated cutting tool is improved. Further, when x in $\text{Ti}(C_xN_{1-x})$ is 0.30 or less, the adhesion to the second layer is excellent, so that the fracture due to peeling is prevented. From the same viewpoint, x in $\text{Ti}(C_xN_{1-x})$ is preferably 0.04 or more and 0.30 or less, and more preferably 0.15 or more and 0.30 or less.

In the present embodiment, when the composition of each compound layer is described as Ti($C_{0.20}N_{0.80}$), it means that the atomic ratio of the C element to the total amount of the C element and the N element is 0.20, and the atomic ratio of the N element to the total amount of the C element and the N element is 0.80. That is, it means that the amount of the C element is 20 atomic % with respect to the total amount of the C element and the N element, and the amount of the N element is 80 atomic % with respect to the total amount of the C element and the N element.

[Second Layer]

In the coated cutting tool of the present embodiment, the second layer is a compound layer having a composition represented by the following formula (2).

$(Ti_yAl_{1-y})N$ (2)

(in the formula, y represents an atomic ratio of a Ti element to a total amount of the Ti element and an Al element, and satisfies 0.25≤y≤0.75).

In the second layer forming the coating layer, when y in $(Ti_yAl_{1-y})N$ is 0.25 or more, by containing Ti, the high temperature strength and the formation of hexagonal crystals can be prevented, and as a result, the wear resistance of the coated cutting tool is improved. Further, when y in $(Ti_yAl_{1-y})N$ is 0.75 or less, the heat resistance is improved, so that the reaction wear can be prevented even in processing with a high cutting temperature such as high-speed processing or high-load processing, and therefore, the wear resistance of the coated cutting tool is improved. From the same viewpoint, y in $(Ti_yAl_{1-y})N$ is preferably 0.27 or more and 0.73 or less, and more preferably 0.30 or more and 0.72 or less.

In the coated cutting tool of the present embodiment, when a lower layer described later is not formed, it is preferable that the second layer is first formed on the surface of the substrate. In the coated cutting tool of the present embodiment, when the second layer is first formed on the surface of the substrate, the adhesion between the substrate and the coating layer tends to be improved.

[Laminated Structure]

The coated cutting tool of the present embodiment has a laminated structure in which the first layer and the second layer are alternately laminated for one or more layers in the coating layer. When the coated cutting tool of the present embodiment has a laminated structure in which the first layer and the second layer are alternately laminated for one or more layers in the coating layer, the interfacial consistency is low, so that the hardness is increased, and as a result, the wear resistance is improved. Further, when the coated cutting tool of the present embodiment has the laminated structure in which the first layer and the second layer are alternately laminated for one or more layers in the coating layer, the adhesion between the layers is also improved, and therefore the fracture due to the lack of peeling resistance can be prevented.

Further, in the coated cutting tool of the present embodiment, the laminated structure includes the first laminated structure, the second laminated structure, and the third laminated structure, in which the average thickness, that is, the lamination period per layer of each of the first layer and the second layer is controlled within a specific range, in this order from the substrate side toward the surface side of the coating layer. Accordingly, in the coated cutting tool of the present embodiment, the adhesion between the layers can be improved and the fracture due to peeling can be prevented, and the wear resistance and the fracture resistance can be simultaneously improved, for example, in lathe processing of difficult-to-cut materials.

Specifically, in the coated cutting tool of the present embodiment, the lamination period in the first laminated structure on the substrate side is set to more than 500 nm and 3000 nm or less, the lamination period in the third laminated structure on the surface side of the coating layer is set to 5 nm or more and 50 nm or less, and the lamination period in the second laminated structure between the first laminated structure and the third laminated structure is set to more than 50 nm and 500 nm or less. In the coated cutting tool of the present embodiment, the laminated structure is such a structure, that is, a structure in which the lamination period is gradually reduced from the substrate side toward the surface side of the coating layer, so that the adhesion between the layers is excellent, and the fracture due to the lack of peeling resistance can be prevented. It is presumed that the reason why the adhesion between the layers is improved is that the increase in the compressive stress of the entire coating layer can be prevented.

When the lamination period in the first laminated structure is more than 500 nm, by increasing the average grain size of the crystal grains contained in the first laminated structure, the adhesion is improved, and therefore, the fracture due to peeling can be prevented. On the other hand, when the lamination period in the first laminated structure is 3000 nm or less, the occurrence of cracks due to the increase in the compressive stress can be prevented by increasing the average thickness of the first layer and the second layer, so that the fracture resistance of the coated cutting tool is improved. From the same viewpoint, the lamination period in the first laminated structure is preferably 505 nm or more and 2900 nm or less, and more preferably 510 nm or more and 2800 nm or less.

Further, when the lamination period in the second laminated structure is more than 50 nm, the adhesion between the first laminated structure and the second laminated structure is improved. It is presumed that this is because the balance between the average grain size of the crystal grains contained in the first laminated structure and the second laminated structure and the compressive stress is excellent. On the other hand, when the lamination period in the second laminated structure is 500 nm or less, the adhesion between the second laminated structure and the third laminated structure is improved. It is presumed that this is because the balance between the average grain size of the crystal grains contained in the second laminated structure and the third laminated structure and the compressive stress is excellent. From the same viewpoint, the lamination period in the second laminated structure is preferably 55 nm or more and 490 nm or less, and more preferably 60 nm or more and 480 nm or less.

Further, when the lamination period in the third laminated structure is 5 nm or more, cracks generated during processing can be prevented from growing toward the substrate, so that the fracture resistance of the coated cutting tool is improved. In addition, it is presumed that by chipping only the surface side of the coating layer, the coating layer on the substrate side remains, and as a result, the wear resistance of the coated cutting tool is improved. On the other hand, when the lamination period in the third laminated structure is 50 nm or less, by reducing the average grain size of the crystal grains contained in the third laminated structure, the increase in the compressive stress on the surface side of the coating layer can be prevented. As a result, the occurrence of cracks is prevented and the fracture resistance of the coated cutting tool is improved. From the same viewpoint, the lamination period in the third laminated structure is preferably 5 nm or more and 48 nm or less, and more preferably 6 nm or more and 45 nm or less.

Further, in the coated cutting tool of the present embodiment, the average thickness of the first laminated structure is more than 1.0 µm and 6.0 µm or less. When the average thickness of the first laminated structure is more than 1.0 µm, the effect of having the first laminated structure can be obtained, and when the average thickness of the first laminated structure is 6.0 µm or less, it is possible to prevent a decrease in the fracture resistance due to a relative decrease in the thickness of the second laminated structure or the third laminated structure. From the same viewpoint, the average thickness of the first laminated structure is preferably 2.0 µm or more and 5.8 µm or less, and more preferably 2.2 µm or more and 5.6 µm or less.

Further, in the coated cutting tool of the present embodiment, the average thickness of the second laminated structure is more than 0.1 µm and 2.0 µm or less. When the average thickness of the second laminated structure is more than 0.1 µm, the effect of having the second laminated structure can be obtained, and when the average thickness of the second laminated structure is 2.0 µm or less, it is possible to prevent a decrease in the adhesion and a decrease in the fracture resistance due to a relative decrease in the thickness of the first laminated structure or the third laminated structure. From the same viewpoint, the average thickness of the second laminated structure is preferably 0.12 µm or more and 1.95 µm or less, and more preferably 0.12 µm or more and 1.92 µm or less.

Further, in the coated cutting tool of the present embodiment, the average thickness of the third laminated structure is 0.1 µm or more and 2.0 µm or less. When the average thickness of the third laminated structure is 0.1 µm or more, the effect of having the third laminated structure can be obtained, and when the average thickness of the third laminated structure is 2.0 µm or less, it is possible to prevent a decrease in the adhesion due to a relative decrease in the thickness of the first laminated structure or the second laminated structure. From the same viewpoint, the average thickness of the third laminated structure is preferably 0.15 µm or more and 0.60 µm or less, and more preferably 0.20 µm or more and 0.54 µm or less.

Further, in the coated cutting tool of the present embodiment, at a position 300 nm from an interface between the substrate and the coating layer toward the surface side of the coating layer, the average grain size of the crystal grains forming the coating layer is preferably 50 nm or more and 500 nm or less. When, at the position 300 nm from the interface between the substrate and the coating layer toward the surface side of the coating layer, the average grain size of the crystal grains forming the coating layer is 50 nm or more, dropping of the grains is prevented, and therefore, the adhesion tends to be improved. Further, when, at the position 300 nm from the interface between the substrate and the coating layer toward the surface side of the coating layer, the average grain size of the crystal grains forming the coating layer is 500 nm or less, the compressive stress increases, and therefore, the fracture resistance of the coated cutting tool tends to be improved. From the same viewpoint, at the position 300 nm from the interface between the substrate and the coating layer toward the surface side of the coating layer, the average grain size of the crystal grains forming the coating layer is more preferably 52 nm or more and 495 nm or less, and still more preferably 54 nm or more and 492 nm or less.

Further, in the coated cutting tool of the present embodiment, at a position 100 nm from a surface opposite to the substrate in the third laminated structure toward the substrate side, the average grain size of the crystal grains forming the coating layer is preferably 5 nm or more and less than 50 nm. When, at the position 100 nm from the surface opposite to the substrate in the third laminated structure toward the substrate side, the average grain size of the crystal grains forming the coating layer is 5 nm or more, peeling can be further prevented by preventing the compressive stress from becoming too high, and therefore, the adhesion tends to be improved. Further, when, at the position 100 nm from the surface opposite to the substrate in the third laminated structure toward the substrate side, the average grain size of the crystal grains forming the coating layer is less than 50 nm, the compressive stress increases, and therefore, the growth of cracks is further prevented. As a result, the fracture resistance of the coated cutting tool tends to be improved. From the same viewpoint, at the position 100 nm from the surface opposite to the substrate in the third laminated structure toward the substrate side, the average grain size of the crystal grains forming the coating layer is more preferably 5 nm or more and 48 nm or less, and still more preferably 5 nm or more and 45 nm or less.

As described above, in the coated cutting tool of the present embodiment, in the coating layer in the vicinity of the interface between the coating layer and the substrate, by controlling the lamination period within a relatively large range, the average grain size of the crystal grains forming the coating layer can be increased. As a result, in the coated cutting tool of the present embodiment, the dropping of the grains can be prevented, and therefore, the adhesion is improved and the fracture due to the lack of peeling resistance tends to be prevented. As described above, in the coated cutting tool of the present embodiment, in the vicinity of the surface of the coating layer opposite to the substrate, by reducing the average grain size of the crystal grains forming the coating layer, the compressive stress increases, and therefore, chipping resistance and the fracture resistance tend to be improved.

In the present embodiment, the average grain size of the crystal grains forming the coating layer is a value obtained by drawing a line in a direction parallel to the surface of the substrate and dividing a length of the line by the number of crystal grains existing on the line. Specifically, the average grain size of the crystal grains forming the coating layer can be measured by a method described in Examples described later. Further, the crystal grains forming the coating layer include either the crystal grains of the compound having the composition represented by the formula (1) or the crystal grains of the compound having the composition represented by the formula (2), or include both the crystal grains of the compound having the composition represented by the formula (1) and the crystal grains of the compound having the composition represented by the formula (2).

In the coated cutting tool of the present embodiment, in the first laminated structure, the number of repetitions of the first layer and the second layer is preferably 1 time or more and 12 times or less, more preferably 1 time or more and 10 times or less, still more preferably 1 time or more and 8 times or less, and particularly preferably 1 time or more and 5 times or less.

In the coated cutting tool of the present embodiment, in the second laminated structure, the number of repetitions of the first layer and the second layer is preferably 1 time or more and 40 times or less, more preferably 1 time or more and 30 times or less, still more preferably 1 time or more and 20 times or less, and particularly preferably 1 time or more and 10 times or less.

In the coated cutting tool of the present embodiment, in the third laminated structure, the number of repetitions of the first layer and the second layer is preferably 1 time or more and 400 times or less, more preferably 2 times or more and 300 times or less, still more preferably 3 times or more and 200 times or less, and particularly preferably 5 times or more and 100 times or less.

In the present embodiment, when the first layer and the second layer are each formed for one time, "the number of repetitions" is 1 time.

The FIGURE is a schematic cross-sectional view showing an example of the coated cutting tool of the present embodiment. A coated cutting tool 8 includes a substrate 1 and a coating layer 7 formed on a surface of the substrate 1. The coating layer 7 has a laminated structure in which a second layer 2 and a first layer 3 are alternately formed 6 times in this order from a substrate 1 side. The laminated structure has a first laminated structure 4, a second laminated structure 5, and a third laminated structure 6 in this order from the substrate 1 side toward a surface side of the coating layer 7.

[Upper Layer]

The coating layer used in the present embodiment may include an upper layer on a surface opposite to the substrate in the third laminated structure. The upper layer is preferably a single layer or a laminate of a compound containing at least one element selected from the group consisting of Ti, Zr, Hf, V, Nb, Ta, Cr, Mo, W, Al, Si, and Y, and at least one element selected from the group consisting of C, N, O, and B (however, the compound having the composition represented by the formula (1) and the compound having the composition represented by the formula (2) are excluded). It is more preferable that the upper layer is a single layer or a laminate of such a compound because the upper layer is more excellent in the wear resistance. Further, from the same viewpoint as above, the upper layer more preferably contains a compound containing at least one element selected from the group consisting of Ti, V, Nb, Ta, Cr, Mo, W, Al, Si, and Y, and at least one element selected from the group consisting of C, N, O, and B (however, the compound having the composition represented by the formula (1) and the compound having the composition represented by the formula (2) are excluded). The upper layer still more preferably contains a compound containing N and at least one element selected from the group consisting of Ti, Nb, Ta, Cr, W, Al, Si, and Y (however, the compound having the composition represented by the formula (2) is excluded). Further, the upper layer may be a single layer or a multilayer (laminate) of two or more layers.

In the coating layer used in the present embodiment, an average thickness of the upper layer is preferably 0.1 µm or more and 3.5 µm or less. When the average thickness of the upper layer is 0.1 µm or more and 3.5 µm or less, the wear resistance tends to be excellent. From the same viewpoint, the average thickness of the upper layer is more preferably 0.2 µm or more and 3.0 µm or less, and still more preferably 0.3 µm or more and 2.5 µm or less.

[Lower Layer]

The coating layer used in the present embodiment preferably includes a lower layer between the substrate and the laminated structure of the first layer and the second layer. Accordingly, the adhesion between the substrate and the coating layer tends to be further improved. Among them, from the same viewpoint as above, the lower layer preferably contains a compound containing at least one element selected from the group consisting of Ti, Zr, Hf, V, Nb, Ta, Cr, Mo, W, Al, Si, and Y, and at least one element selected from the group consisting of C, N, O, and B (however, the compound having the composition represented by the formula (1) and the compound having the composition represented by the formula (2) are excluded). The lower layer more preferably contains a compound containing at least one element selected from the group consisting of Ti, V, Nb, Ta, Cr, Mo, W, Al, Si, and Y, and at least one element selected from the group consisting of C, N, O, and B (however, the compound having the composition represented by the formula (1) and the compound having the composition represented by the formula (2) are excluded). The lower layer still more preferably contains a compound containing N and at least one element selected from the group consisting of Ti, Ta, Cr, W, Al, Si, and Y (however, the compound having the composition represented by the formula (2) is excluded). Further, the lower layer may be a single layer or a multilayer of two or more layers.

In the coating layer used in the present embodiment, an average thickness of the lower layer is preferably 0.1 µm or more and 3.5 µm or less. When the average thickness of the lower layer is 0.1 µm or more and 3.5 µm or less, the adhesion between the substrate and the coating layer tends to be further improved. From the same viewpoint, the average thickness of the lower layer is more preferably 0.2 µm or more and 3.0 µm or less, and still more preferably 0.3 µm or more and 2.5 µm or less.

[Method of Manufacturing Coating Layer]

A method of manufacturing the coating layer in the coated cutting tool of the present embodiment is not particularly limited, and includes, for example, a physical vapor deposition method such as an ion plating method, an arc ion plating method, a sputtering method, and an ion mixing method. Use of the physical vapor deposition method for forming the coating layer is preferred because a sharp edge can be formed. Among them, the arc ion plating method is more preferred because the adhesion between the coating layer and the substrate is more excellent.

[Method of Manufacturing Coated Cutting Tool]

A method of manufacturing the coated cutting tool of the present embodiment will be described below with reference to specific examples. The method of manufacturing the coated cutting tool of the present embodiment is not particularly limited as long as a configuration of the coated cutting tool can be implemented.

First, a substrate processed into a tool shape is housed in a reaction vessel of a physical vapor deposition device, and a metal evaporation source is disposed in the reaction vessel. Then, the inside of the reaction vessel is evacuated until a pressure thereof is a vacuum of $1.0 \times 10^{-2}$ Pa or less, and the substrate is heated to a temperature of 200° C. to 700° C. by a heater in the reaction vessel. After heating, Ar gas is introduced into the reaction vessel to make the pressure in the reaction vessel to 0.5 Pa to 5.0 Pa. In an Ar gas atmosphere with a pressure of 0.5 Pa to 5.0 Pa, a bias voltage of −500 V to −350 V is applied to the substrate, a current of 40 A to 50 A is flowed through a tungsten filament in the reaction vessel, and the surface of the substrate is subjected to an ion bombardment treatment with Ar gas. After the surface of the substrate is subjected to the ion bombardment treatment, the inside of the reaction vessel is evacuated until the pressure is a vacuum of $1.0 \times 10^{-2}$ Pa or less.

When forming the lower layer used in the present embodiment, the substrate is heated until the temperature reaches 400° C. to 600° C. After heating, gas is introduced into the reaction vessel to make the pressure in the reaction vessel to 0.5 Pa to 5.0 Pa. The gas is, for example, $N_2$ gas when the lower layer is formed of a compound containing N and at least one element selected from the group consisting of Ti, Zr, Hf, V, Nb, Ta, Cr, Mo, W, Al, Si, and Y, and the gas is, for example, mixed gas of $N_2$ gas and $C_2H_2$ gas when the lower layer is formed of a compound containing N, C, and at least one element selected from the group consisting of Ti, Zr, Hf, V, Nb, Ta, Cr, Mo, W, Al, Si, and Y. A volume ratio of the mixed gas is not particularly limited, and may be, for example, $N_2$ gas: $C_2H_2$ gas=95:5 to 85:15. Next, it is preferable that a bias voltage of −80 V to −40 V is applied to the substrate, and the metal evaporation source corresponding to a metal component of each layer is evaporated by an arc discharge of an arc current of 100 A to 200 A to form the lower layer.

When forming the first layer used in the present embodiment, the temperature of the substrate is controlled to 350° C. to 550° C., nitrogen gas ($N_2$) is introduced into the reaction vessel, and the pressure in the reaction vessel is adjusted to 1.0 Pa to 5.0 Pa. Then, a bias voltage of −60 V to −40 V is applied to the substrate, and a TiC evaporation source is evaporated by an arc discharge of 80 A to 150 A to form the first layer.

When forming the second layer used in the present embodiment, the temperature of the substrate is controlled to 350° C. to 550° C. It is preferable that the temperature of the substrate is the same as the temperature of the substrate when the first layer is formed because the first layer and the second layer can be formed continuously. After controlling the temperature, $N_2$ gas is introduced into the reaction vessel to make the pressure in the reaction vessel to 1.0 Pa to 5.0 Pa. Next, it is preferable that a bias voltage of −100 V to −20 V is applied to the substrate, and a metal evaporation source corresponding to a metal component of the second layer is evaporated by an arc discharge of an arc current of 80 A to 150 A to form the second layer.

In order to form the laminated structure in which the first layer and the second layer are alternately laminated for one or more layers, it is preferable that each layer is formed alternately by alternately evaporating the TiC evaporation source and the metal evaporation source by the arc discharge under the above conditions. By adjusting an arc discharge time of the TiC evaporation source and the metal evaporation source, the thickness of each layer forming the laminated structure can be controlled, and the first laminated structure, the second laminated structure, and the third laminated structure in which the lamination period is controlled in the specific range can be formed.

When the pressure in the reaction vessel is increased in the case of forming the first layer, a ratio of the N element in the composition represented by the formula (1) decreases, and a ratio (x) of the C element can be increased.

In order to set the average grain size of the crystal grains in the first layer used in the present embodiment to a predetermined value, it is preferable that the bias voltage and an amount of a raw material (TiC) containing the C element are adjusted in the process of forming the first layer described above. More specifically, in the process of forming the first layer, when a negative bias voltage is increased (on a side far from zero), the average grain size of the crystal grains in the first layer tends to decrease. When the amount of the raw material containing the element C is increased in the process of forming the first layer, the average grain size of the crystal grains in the first layer tends to decrease. Further, as the average thickness per layer of the first layer is thinner, the average grain size of the crystal grains in the first layer tends to decrease.

In order to set the average grain size of the crystal grains in the second layer used in the present embodiment to a predetermined value, it is preferable that the bias voltage is adjusted in the process of forming the second layer described above. More specifically, in the process of forming the second layer, when a negative bias voltage is increased (on a side far from zero), the average grain size of the crystal grains in the second layer tends to decrease. An aspect ratio tends to increase as the average grain size of the crystal grains in the second layer decreases. Further, as the average thickness per layer of the second layer is thinner, the average grain size of the crystal grains in the second layer tends to decrease.

When forming the upper layer used in the present embodiment, it is preferable that the upper layer is formed under the same manufacturing conditions as those of the lower layer described above. That is, first, the substrate is heated until the temperature thereof reaches 400° C. to 600° C. After heating, gas is introduced into the reaction vessel to make the pressure in the reaction vessel to 0.5 Pa to 5.0 Pa. The gas is, for example, $N_2$ gas when the upper layer is formed of a compound containing N and at least one element selected from the group consisting of Ti, Zr, Hf, V, Nb, Ta, Cr, Mo, W, Al, Si, and Y, and the gas is, for example, mixed gas of $N_2$ gas and $C_2H_2$ gas when the upper layer is formed of a compound containing N, C, and at least one element selected from the group consisting of Ti, Zr, Hf, V, Nb, Ta, Cr, Mo, W, Al, Si, and Y. A volume ratio of the mixed gas is not particularly limited, and may be, for example, $N_2$ gas: $C_2H_2$ gas=95:5 to 85:15. Next, it is preferable that a bias voltage of −80 V to −40 V is applied to the substrate, and the metal evaporation source corresponding to a metal component of each layer is evaporated by an arc discharge of an arc current of 100 A to 200 A to form the upper layer.

The thickness of each layer forming the coating layer in the coated cutting tool of the present embodiment is measured from a cross-sectional structure of the coated cutting tool using an optical microscope, a scanning electron microscope (SEM), a transmission electron microscope (TEM), or the like. The average thickness of each layer in the coated cutting tool of the present embodiment can be obtained by measuring the thickness of each layer from three or more cross sections in the vicinity of a position 50 µm from a cutting edge ridgeline portion of a surface facing the metal evaporation source toward a center portion of the surface and by calculating an average value (arithmetic mean value).

Further, the composition of each layer forming the coating layer in the coated cutting tool of the present embodiment can be measured from the cross-sectional structure of the coated cutting tool of the present embodiment by using an energy dispersive X-ray analyzer (EDS) or a wavelength dispersive X-ray analyzer (WDS).

It is considered that the coated cutting tool of the present embodiment has an effect that the tool life can be extended as compared with that in the related art because the coated cutting tool is excellent in at least wear resistance and fracture resistance (however, the factors that can extend the tool life are not limited to the above). Specific examples of types of the coated cutting tool of the present embodiment include an indexable cutting insert for milling or lathe processing, a drill, or an end mill.

EXAMPLES

Hereinafter, the invention will be described in more detail by way of Examples, but the invention is not limited to these Examples.

Example 1

As a substrate, an insert of CNMG120408-SM (cemented carbide having a composition of 89.6WC-9.8Co-0.6Cr$_3$C$_2$ (mass %)) was prepared. A TiC evaporation source and a metal evaporation source were disposed in a reaction vessel of an arc ion plating device so as to have a composition of each layer shown in Tables 1 and 2. The prepared substrate was fixed to a fixing bracket of a rotary table in the reaction vessel.

Then, the inside of the reaction vessel was evacuated until a pressure was a vacuum of $5.0\times10^{-3}$ Pa or less. After evacuation, the substrate was heated to a temperature of 450° C. by a heater in the reaction vessel. After heating, Ar gas was introduced into the reaction vessel to make the pressure to 2.7 Pa.

In an Ar gas atmosphere with a pressure of 2.7 Pa, a bias voltage of −400 V to was applied to the substrate, a current of 40 A was flowed through a tungsten filament in the reaction vessel, and a surface of the substrate was subjected to an ion bombardment treatment with Ar gas for 30 minutes. After the ion bombardment treatment was completed, the inside of the reaction vessel was evacuated until the pressure was a vacuum of $5.0\times10^{-3}$ Pa or less.

For Invention Products 1 to 21, after evacuation, the temperature of the substrate was controlled to a temperature (a temperature at the start of film formation) shown in Table 3, nitrogen gas (N$_2$) was introduced into the reaction vessel, and the pressure inside the reaction vessel was adjusted to a pressure shown in Table 3. Then, a bias voltage shown in Table 3 was applied to the substrate, and the TiC evaporation source of the first layer having the composition shown in Table 1 and the metal evaporation source of the second layer having the composition shown in Table 1 were alternately evaporated in the order, in which the lowest layer shown in Table 1 was first formed on the surface of the substrate, by an arc discharge of an arc current shown in Table 3, to alternately form the first layer and the second layer. Thereby, the first laminated structure, the second laminated structure, and the third laminated structure were formed in this order. At this time, the pressure in the reaction vessel shown in Table 3 was controlled. Further, the thickness of the first layer and the thickness of the second layer, and the thicknesses of the first laminated structure, the second laminated structure, and the third laminated structure were controlled by adjusting respective arc discharge times so as to have thicknesses shown in Table 1.

For Comparative Products 1 to 17, after evacuation, the temperature of the substrate was controlled to a temperature (a temperature at the start of film formation) shown in Table 4, nitrogen gas (N$_2$) was introduced into the reaction vessel, and the pressure inside the reaction vessel was adjusted to a pressure shown in Table 4. Then, a bias voltage shown in Table 4 was applied to the substrate, and a TiC evaporation source of an A layer having the composition shown in Table 2 and a metal evaporation source of a B layer having the composition shown in Table 2 were alternately evaporated in the order, in which the lowest layer shown in Table 2 was first formed on the surface of the substrate, by an arc discharge of an arc current shown in Table 4, to alternately form the A layer and the B layer in the order in which the lowest layer shown in Table 2 was the first surface of the substrate. Thereby, the first laminated structure, the second laminated structure, and the third laminated structure were formed in this order. At this time, the pressure in the reaction vessel shown in Table 4 was controlled. Further, a thickness of the A layer and a thickness of the B layer, and the thicknesses of the first laminated structure, the second laminated structure, and the third laminated structure were controlled by adjusting respective arc discharge times so as to have thicknesses shown in Table 2.

After forming each layer and laminated structure on the surface of the substrate until each layer and laminated structure had a predetermined average thickness as shown in Tables 1 and 2, the heater was turned off, and after a temperature of a sample was 100° C. or lower, the sample was taken out from the reaction vessel.

TABLE 1

| | | Coating layer | | | | | | | | |
|---|---|---|---|---|---|---|---|---|---|---|
| | | First laminated structure | | | | | Second laminated structure | | | |
| | | First layer: Ti(C$_x$N$_{1-x}$) | | Second layer: (Ti$_y$Al$_{1-y}$)N | | | First layer: Ti(C$_x$N$_{1-x}$) | | Second layer: (Ti$_y$Al$_{1-y}$)N | |
| | Lowest layer | Atomic ratio x of C element | Average thickness (nm) | Atomic ratio y of Ti element | Average thickness (nm) | Number of repetitions (times) | Average thickness (μm) | Atomic ratio x of C element | Average thickness (nm) | Atomic ratio y of Ti element | Average thickness (nm) |
| Invention Product 1 | Second layer | 0.04 | 1200 | 0.50 | 1200 | 2 | 4.80 | 0.04 | 100 | 0.50 | 100 |
| Invention Product 2 | Second layer | 0.30 | 1200 | 0.50 | 1200 | 2 | 4.80 | 0.30 | 100 | 0.50 | 100 |
| Invention Product 3 | Second layer | 0.20 | 1200 | 0.50 | 1200 | 2 | 4.80 | 0.20 | 100 | 0.50 | 100 |
| Invention Product 4 | Second layer | 0.20 | 1200 | 0.30 | 1200 | 2 | 4.80 | 0.20 | 100 | 0.30 | 100 |
| Invention Product 5 | Second layer | 0.20 | 1200 | 0.72 | 1200 | 2 | 4.80 | 0.20 | 100 | 0.72 | 100 |
| Invention Product 6 | Second layer | 0.20 | 510 | 0.50 | 510 | 5 | 5.10 | 0.20 | 100 | 0.50 | 100 |
| Invention Product 7 | Second layer | 020 | 2800 | 0.50 | 2800 | 1 | 5.60 | 0.20 | 100 | 0.50 | 100 |
| Invention Product 8 | Second layer | 0.20 | 1000 | 0.50 | 1000 | 2 | 4.00 | 0.20 | 480 | 0.50 | 480 |
| Invention Product 9 | Second layer | 0.20 | 1200 | 0.50 | 1200 | 2 | 4.80 | 0.20 | 100 | 0.50 | 100 |

TABLE 1-continued

| | | | | | | | | | | | |
|---|---|---|---|---|---|---|---|---|---|---|---|
| Invention Product 10 | Second layer | 0.20 | 1200 | 0.50 | 1200 | 2 | 4.80 | 0.20 | 100 | 0.50 | 100 |
| Invention Product 11 | First layer | 0.20 | 510 | 0.50 | 510 | 4 | 1.02 | 0.20 | 100 | 0.50 | 100 |
| Invention product 12 | Second layer | 0.20 | 1200 | 0.50 | 1200 | 2 | 4.80 | 0.20 | 60 | 0.50 | 60 |
| Invention Product 13 | Second layer | 0.20 | 1200 | 0.50 | 1200 | 2 | 4.80 | 0.20 | 100 | 0.50 | 100 |
| Invention Product 14 | Second layer | 0.20 | 550 | 0.50 | 550 | 2 | 2.20 | 0.20 | 150 | 0.50 | 150 |
| Invention Product 15 | Second layer | 0.20 | 1000 | 0.50 | 1000 | 3 | 6.00 | 0.20 | 100 | 0.50 | 100 |
| Invention Product 16 | Second layer | 0.20 | 1200 | 0.50 | 1200 | 2 | 4.80 | 0.20 | 100 | 0.50 | 100 |
| Invention Product 17 | Second layer | 020 | 2400 | 0.50 | 2400 | 1 | 4.80 | 0.20 | 100 | 0.50 | 100 |
| Invention Product 18 | First layer | 0.20 | 1200 | 0.50 | 1200 | 2 | 4.80 | 0.20 | 100 | 0.50 | 100 |
| Invention Product 19 | Second layer | 0.20 | 2000 | 0.50 | 2000 | 1 | 4.00 | 0.20 | 100 | 0.50 | 100 |
| Invention Product 20 | Second layer | 0.20 | 1500 | 0.50 | 1500 | 2 | 6.00 | 0.20 | 100 | 0.50 | 100 |
| Invention Product 21 | Second layer | 0.15 | 1200 | 0.50 | 1200 | 2 | 4.80 | 0.20 | 100 | 0.50 | 100 |

| | Coating layer | | | | | | |
|---|---|---|---|---|---|---|---|
| | Second laminated structure | | Third laminated structure | | | | |
| | | | First layer: $Ti(C_xN_{1-x})$ | | Second layer: $(Ti_yAl_{1-y})N$ | | |
| | Number of repetitions (times) | Average thickness (μm) | Atomic ratio x of C element | Average thickness (nm) | Atomic ratio y of Ti element | Average thickness (nm) | Number of repetitions (times) | Average thickness (μm) | Total thickness (μm) |
| Invention Product 1 | 4 | 0.80 | 0.04 | 10 | 0.50 | 10 | 20 | 0.40 | 6.00 |
| Invention Product 2 | 4 | 0.80 | 0.30 | 10 | 0.50 | 10 | 20 | 0.40 | 6.00 |
| Invention Product 3 | 4 | 0.80 | 0.20 | 10 | 0.50 | 10 | 20 | 0.40 | 6.00 |
| Invention Product 4 | 4 | 0.80 | 0.20 | 10 | 0.30 | 10 | 20 | 0.40 | 6.00 |
| Invention Product 5 | 4 | 0.80 | 0.20 | 10 | 0.72 | 10 | 20 | 0.40 | 6.00 |
| Invention Product 6 | 4 | 0.80 | 0.20 | 10 | 0.50 | 10 | 20 | 0.40 | 6.30 |
| Invention Product 7 | 4 | 0.80 | 0.20 | 10 | 0.50 | 10 | 20 | 0.40 | 6.80 |
| Invention Product 8 | 2 | 1.92 | 0.20 | 10 | 0.50 | 10 | 20 | 0.40 | 6.32 |
| Invention Product 9 | 4 | 0.80 | 0.20 | 6 | 0.50 | 6 | 40 | 0.48 | 6.08 |
| Invention Product 10 | 4 | 0.80 | 0.20 | 45 | 0.50 | 45 | 6 | 0.54 | 6.14 |
| Invention Product 11 | 10 | 2.00 | 0.20 | 10 | 0.50 | 10 | 100 | 2.00 | 5.02 |
| Invention product 12 | 1 | 0.12 | 0.20 | 10 | 0.50 | 10 | 20 | 0.40 | 5.32 |
| Invention Product 13 | 4 | 0.80 | 0.20 | 10 | 0.50 | 10 | 5 | 0.10 | 5.70 |
| Invention Product 14 | 3 | 0.90 | 0.20 | 20 | 0.50 | 20 | 23 | 0.92 | 4.02 |
| Invention Product 15 | 10 | 2.00 | 0.20 | 10 | 0.50 | 10 | 100 | 2.00 | 10.00 |
| Invention Product 16 | 4 | 0.80 | 0.20 | 10 | 0.50 | 10 | 20 | 0.40 | 6.00 |
| Invention Product 17 | 4 | 0.80 | 0.20 | 10 | 0.50 | 10 | 20 | 0.40 | 6.00 |
| Invention Product 18 | 4 | 0.80 | 0.20 | 45 | 0.50 | 45 | 6 | 0.54 | 6.14 |
| Invention Product 19 | 3 | 0.60 | 0.20 | 10 | 0.50 | 10 | 10 | 0.20 | 4.80 |
| Invention Product 20 | 3 | 0.60 | 0.20 | 10 | 0.50 | 10 | 10 | 0.20 | 6.80 |
| Invention Product 21 | 4 | 0.80 | 0.20 | 10 | 0.50 | 10 | 20 | 0.40 | 6.00 |

TABLE 2

| | | First laminated structure | | | | | Coating layer Second laminated structure | | | | | | Third laminated structure | | | | | Total thickness (μm) |
|---|---|---|---|---|---|---|---|---|---|---|---|---|---|---|---|---|---|---|
| | | A layer: Ti(C$_x$N$_{1-x}$) | B layer: (Ti$_y$Al$_{1-y}$)N | | | | A layer: Ti(C$_x$N$_{1-x}$) | B layer: (Ti$_y$Al$_{1-y}$)N | | | | | A layer: Ti(C$_x$N$_{1-x}$) | B layer: (Ti$_y$Al$_{1-y}$)N | | | | |
| | Lowest layer | Atomic ratio x of C element | Average thickness (nm) | Atomic ratio y of Ti element | Average thickness (nm) | Number of repetitions (times) | Average thickness (μm) | Atomic ratio x of C element | Average thickness (nm) | Atomic ratio y of Ti element | Average thickness (nm) | Number of repetitions (times) | Average thickness (μm) | Atomic ratio x of C element | Average thickness (nm) | Atomic ratio y of Ti element | Average thickness (nm) | Number of repetitions (times) | Average thickness (μm) | |
| Comparative Product 1 | B layer | 0.00 | 1200 | 0.50 | 1200 | 2 | 4.80 | 0.00 | 100 | 0.50 | 100 | 4 | 0.80 | 0.00 | 10 | 0.50 | 10 | 20 | 0.40 | 6.00 |
| Comparative Product 2 | B layer | 0.35 | 1200 | 0.50 | 1200 | 2 | 4.80 | 0.35 | 100 | 0.50 | 100 | 4 | 0.80 | 0.35 | 10 | 0.50 | 10 | 20 | 0.40 | 6.00 |
| Comparative Product 3 | B layer | 0.20 | 1200 | 0.20 | 1200 | 2 | 4.80 | 0.20 | 100 | 0.20 | 100 | 4 | 0.80 | 0.20 | 10 | 0.20 | 10 | 20 | 0.40 | 6.00 |
| Comparative Product 4 | B layer | 0.20 | 1200 | 0.80 | 1200 | 2 | 4.80 | 0.20 | 100 | 0.80 | 100 | 4 | 0.80 | 0.20 | 10 | 0.80 | 10 | 20 | 0.40 | 6.00 |
| Comparative Product 5 | B layer | 0.20 | 350 | 0.50 | 350 | 7 | 4.90 | 0.20 | 100 | 0.50 | 100 | 4 | 0.80 | 0.20 | 10 | 0.50 | 10 | 20 | 0.40 | 6.10 |
| Comparative Product 6 | B layer | 0.20 | 3200 | 0.50 | 3200 | 1 | 6.40 | 0.20 | 100 | 0.50 | 100 | 2 | 0.40 | 0.20 | 10 | 0.50 | 10 | 10 | 0.20 | 7.00 |
| Comparative Product 7 | B layer | 0.20 | 1200 | 0.50 | 1200 | 2 | 4.80 | 0.20 | 600 | 0.50 | 600 | 1 | 1.20 | 0.20 | 10 | 0.50 | 10 | 20 | 0.40 | 6.40 |
| Comparative Product 8 | B layer | 0.20 | 1200 | 0.50 | 1200 | 2 | 4.80 | 0.20 | 100 | 0.50 | 100 | 4 | 0.80 | 0.20 | 2 | 0.50 | 2 | 120 | 0.48 | 6.08 |
| Comparative Product 9 | B layer | 0.20 | 1200 | 0.50 | 1200 | 2 | 4.80 | 0.20 | 100 | 0.50 | 100 | 4 | 0.80 | 0.20 | 70 | 0.50 | 70 | 3 | 0.42 | 6.02 |
| Comparative Product 10 | A layer | 0.20 | 300 | 0.50 | 300 | 1 | 0.60 | 0.20 | 30 | 0.50 | 30 | 10 | 2.00 | 0.20 | 10 | 0.50 | 10 | 100 | 2.00 | 4.60 |
| Comparative Product 11 | B layer | 0.20 | 1200 | 0.50 | 1200 | 2 | 4.80 | 0.20 | 100 | 0.50 | 100 | 1 | 0.06 | 0.20 | 10 | 0.50 | 10 | 20 | 0.40 | 5.26 |
| Comparative Product 12 | B layer | 0.20 | 1200 | 0.50 | 1200 | 2 | 4.80 | 0.20 | 100 | 0.50 | 100 | 4 | 0.80 | 0.20 | 10 | 0.50 | 10 | 2 | 0.04 | 5.64 |
| Comparative Product 13 | B layer | 0.20 | 400 | 0.50 | 400 | 2 | 1.60 | 0.20 | 150 | 0.50 | 150 | 3 | 0.90 | 0.20 | 20 | 0.50 | 20 | 23 | 0.92 | 3.42 |
| Comparative Product 14 | B layer | 0.20 | 1000 | 0.50 | 1000 | 3 | 6.00 | 0.20 | 100 | 0.50 | 100 | 10 | 2.00 | 0.20 | 10 | 0.50 | 10 | 150 | 3.00 | 11.00 |
| Comparative Product 15 | B layer | 0.20 | 400 | 0.50 | 400 | 8 | 6.40 | 0.20 | 100 | 0.50 | 100 | 4 | 0.80 | 0.20 | 10 | 0.50 | 10 | 20 | 0.40 | 7.60 |
| Comparative Product 16 | B layer | 0.20 | 2400 | 0.50 | 2400 | 1 | 4.80 | 0.20 | 100 | 0.50 | 100 | 14 | 2.80 | 0.20 | 10 | 0.50 | 10 | 20 | 0.40 | 8.00 |
| Comparative Product 17 | A layer | 0.20 | 1200 | 0.50 | 1200 | 2 | 4.80 | 0.20 | 100 | 0.50 | 100 | 4 | 0.80 | 0.20 | 65 | 0.50 | 65 | 5 | 0.65 | 6.25 |

TABLE 3

| | First layer | | | | Second layer | | | |
|---|---|---|---|---|---|---|---|---|
| | Temperature (° C.) | Pressure (Pa) | Voltage (V) | Current (A) | Temperature (° C.) | Pressure (Pa) | Voltage (V) | Current (A) |
| Invention Product 1 | 450 | 1.0 | −60 | 120 | 450 | 1.0 | −60 | 120 |
| Invention Product 2 | 450 | 5.0 | −60 | 120 | 450 | 5.0 | −60 | 120 |
| Invention Product 3 | 450 | 3.0 | −60 | 120 | 450 | 3.0 | −60 | 120 |
| Invention Product 4 | 450 | 3.0 | −60 | 120 | 450 | 3.0 | −60 | 120 |
| Invention Product 5 | 350 | 3.0 | −60 | 120 | 350 | 3.0 | −60 | 120 |
| Invention Product 6 | 450 | 3.0 | −60 | 120 | 450 | 3.0 | −60 | 120 |
| Invention Product 7 | 450 | 3.0 | −60 | 120 | 450 | 3.0 | −60 | 120 |
| Invention Product 8 | 450 | 3.0 | −60 | 120 | 450 | 3.0 | −60 | 120 |
| Invention Product 9 | 450 | 3.0 | −60 | 120 | 450 | 3.0 | −60 | 120 |
| Invention Product 10 | 450 | 3.0 | −60 | 120 | 450 | 3.0 | −60 | 120 |
| Invention Product 11 | 450 | 3.0 | −60 | 120 | 450 | 3.0 | −60 | 120 |
| Invention Product 12 | 450 | 3.0 | −60 | 120 | 450 | 3.0 | −60 | 120 |
| Invention Product 13 | 450 | 3.0 | −60 | 120 | 450 | 3.0 | −60 | 120 |
| Invention Product 14 | 450 | 3.0 | −60 | 80 | 450 | 3.0 | −60 | 80 |
| Invention Product 15 | 450 | 3.0 | −60 | 80 | 450 | 3.0 | −60 | 80 |
| Invention Product 16 | 450 | 3.0 | −60 | 120 | 450 | 3.0 | −100 | 120 |
| Invention Product 17 | 450 | 3.0 | −40 | 120 | 450 | 3.0 | −20 | 120 |
| Invention Product 18 | 550 | 3.0 | −60 | 120 | 550 | 3.0 | −60 | 120 |
| Invention Product 19 | 450 | 3.0 | −60 | 120 | 450 | 3.0 | −60 | 120 |
| Invention Product 20 | 450 | 3.0 | −60 | 120 | 450 | 3.0 | −60 | 120 |
| Invention Product 21 | 550 | 2.4 | −60 | 120 | 550 | 2.4 | −60 | 120 |

TABLE 4

| | A layer | | | | B layer | | | |
|---|---|---|---|---|---|---|---|---|
| | Temperature (° C.) | Pressure (Pa) | Voltage (V) | Current (A) | Temperature (° C.) | Pressure (Pa) | Voltage (V) | Current (A) |
| Comparative Product 1 | 450 | 3.0 | −60 | 120 | 450 | 3.0 | −60 | 120 |
| Comparative Product 2 | 450 | 5.5 | −80 | 120 | 450 | 5.5 | −60 | 120 |
| Comparative Product 3 | 450 | 3.0 | −60 | 120 | 450 | 3.0 | −60 | 120 |
| Comparative Product 4 | 350 | 3.0 | −60 | 120 | 350 | 3.0 | −60 | 120 |
| Comparative Product 5 | 450 | 3.0 | −60 | 120 | 450 | 3.0 | −80 | 120 |
| Comparative Product 6 | 450 | 3.0 | −60 | 120 | 450 | 3.0 | −60 | 120 |
| Comparative Product 7 | 450 | 3.0 | −60 | 120 | 450 | 3.0 | −60 | 120 |
| Comparative Product 8 | 450 | 3.0 | −60 | 120 | 450 | 3.0 | −60 | 120 |
| Comparative Product 9 | 450 | 3.0 | −60 | 120 | 450 | 3.0 | −60 | 120 |
| Comparative Product 10 | 450 | 3.0 | −60 | 120 | 450 | 3.0 | −60 | 120 |
| Comparative Product 11 | 450 | 3.0 | −60 | 120 | 450 | 3.0 | −60 | 120 |
| Comparative Product 12 | 450 | 3.0 | −60 | 120 | 450 | 3.0 | −60 | 120 |
| Comparative Product 13 | 450 | 3.0 | −60 | 80 | 450 | 3.0 | −60 | 80 |
| Comparative Product 14 | 450 | 3.0 | −60 | 80 | 450 | 3.0 | −60 | 80 |
| Comparative Product 15 | 450 | 3.0 | −60 | 120 | 450 | 3.0 | −100 | 120 |
| Comparative Product 16 | 450 | 3.0 | −20 | 120 | 450 | 3.0 | −20 | 120 |
| Comparative Product 17 | 550 | 3.0 | −60 | 120 | 550 | 3.0 | −60 | 120 |

An average thickness of each layer of the obtained sample was obtained by observing, using a TEM, three cross sections in the vicinity of a position 50 μm from a cutting edge ridgeline portion of a surface of the coated cutting tool facing the metal evaporation source toward a center portion of the surface, measuring the thickness of each layer, and calculating an average value (arithmetic mean value). The results are also shown in Tables 1 and 2.

The composition of each layer of the obtained sample was measured by using an EDS attached to the TEM in a cross section in the vicinity of the position 50 μm from the cutting edge ridgeline portion of the surface of the coated cutting tool facing the metal evaporation source toward the center portion. Measurement results are shown in Tables 1 and 2. Composition ratios of metal elements in each of the layers in Tables 1 and 2 indicate atomic ratios of the metal elements to the entire metal element in a metal compound forming each layer.

[Average Grain Size]

For the obtained sample, an average grain size of crystal grains at a position 300 nm from the interface between the substrate and the coating layer toward the surface side of the coating layer (hereinafter, also simply referred to as "the position 300 nm from the substrate"), and an average grain size of crystal grains at a position 100 nm from the surface of the third laminated structure opposite to the substrate toward the substrate side (hereinafter, also simply referred to as "the position 100 nm from the surface of the third laminated structure") was measured by using a commercially available transmission electron microscope (TEM) as follows. First, by using a focused ion beam (FIB) processing machine, a thin film sample with a cross section of the coating layer (a cross section in a direction same as a direction of observing the thickness of the coating layer perpendicular to the surface of the substrate) as an observation surface was prepared. A photograph of a scanning transmission electron image (STEM image) was taken on the observation surface of the prepared sample. A straight line was drawn in a direction parallel to the surface of the substrate at the position 300 nm from the substrate on the taken photograph, and the number of crystal grains existing on the line was measured. A length of the straight line was divided by the number of crystal grains existing on the line, and the obtained value was taken as the average grain size of the crystal grains at the position 300 nm from the substrate. At this time, the length of the straight line was set to 10 μm or more. Similarly, at the position 100 nm from the surface of the third laminated structure on the taken photograph, a straight line was drawn in a direction parallel to the surface of the substrate. A length of the straight line was divided by the number of crystal grains existing on the line, and the obtained value was taken as the average grain size of the crystal grains at the position 100 nm from the surface of the third laminated structure. Measurement results are shown in Tables 5 and 6.

TABLE 5

| | Coating layer | |
|---|---|---|
| | Average grain size (nm) of crystal grains at position 300 nm from substrate | Average grain size (nm) of crystal grains at position 100 nm from surface of third laminated structure |
| Invention Product 1 | 218 | 32 |
| Invention Product 2 | 184 | 12 |
| Invention Product 3 | 202 | 18 |
| Invention Product 4 | 213 | 21 |
| Invention Product 5 | 186 | 10 |
| Invention Product 6 | 126 | 14 |
| Invention Product 7 | 264 | 18 |
| Invention Product 8 | 205 | 14 |
| Invention Product 9 | 218 | 5 |
| Invention Product 10 | 214 | 22 |
| Invention Product 11 | 130 | 12 |
| Invention Product 12 | 212 | 16 |
| Invention Product 13 | 215 | 25 |
| Invention Product 14 | 132 | 13 |
| Invention Product 15 | 208 | 10 |
| Invention Product 16 | 54 | 15 |
| Invention Product 17 | 492 | 15 |
| Invention Product 18 | 224 | 45 |
| Invention Product 19 | 209 | 11 |
| Invention Product 20 | 217 | 14 |
| Invention Product 21 | 207 | 22 |

TABLE 6

| | Coating layer | |
|---|---|---|
| | Average grain size (nm) of crystal grains at position 300 nm from substrate | Average grain size (nm) of crystal grains at position 100 nm from surface of third laminated structure |
| Comparative Product 1 | 218 | 55 |
| Comparative Product 2 | 184 | 5 |
| Comparative Product 3 | 213 | 21 |
| Comparative Product 4 | 196 | 8 |
| Comparative Product 5 | 126 | 14 |
| Comparative Product 6 | 264 | 18 |
| Comparative Product 7 | 205 | 14 |
| Comparative Product 8 | 218 | 5 |
| Comparative Product 9 | 214 | 22 |
| Comparative Product 10 | 130 | 12 |
| Comparative Product 11 | 212 | 16 |
| Comparative Product 12 | 215 | 25 |
| Comparative Product 13 | 132 | 13 |
| Comparative Product 14 | 208 | 10 |
| Comparative Product 15 | 32 | 11 |
| Comparative Product 16 | 590 | 24 |
| Comparative Product 17 | 224 | 76 |

By using the obtained sample, the following cutting test was performed and evaluated.

[Cutting Test]

Work material: SUS304

Work material shape: 120 mm×400 mm round bar

Cutting speed: 150 m/min

Feed rate: 0.25 mm/rev

Depth of cut: 2.0 mm

Coolant: use

Evaluation item: the tool life was defined as when a sample was fractured (a cutting edge portion of the sample was chipped) or a flank wear width reached 0.30 mm, and the processing time until the tool life was measured. Further, a damage state when the processing time was 10 minutes was observed by an SEM. The damage state of "chipping" when the processing time is 10 minutes means that the sample is chipped to the extent that the processing can be continued. Further, a long processing time means that the fracture resistance and the wear resistance are excellent. Obtained results of the evaluation are shown in Tables 7 and 8.

TABLE 7

| | Cutting test | |
|---|---|---|
| | Damage state when processing time is 10 minutes | Processing time (minutes) |
| Invention Product 1 | Normal wear | 23 |
| Invention Product 2 | Normal wear | 34 |
| Invention Product 3 | Normal wear | 38 |
| Invention Product 4 | Normal wear | 25 |
| Invention Product 5 | Normal wear | 26 |
| Invention Product 6 | Normal wear | 30 |
| Invention Product 7 | Normal wear | 28 |
| Invention Product 8 | Normal wear | 34 |
| Invention Product 9 | Normal wear | 32 |
| Invention Product 10 | Normal wear | 27 |
| Invention Product 11 | Normal wear | 26 |
| Invention Product 12 | Normal wear | 95 |
| Invention Product 13 | Normal wear | 23 |
| Invention Product 14 | Normal wear | 22 |
| Invention Product 15 | Normal wear | 32 |
| Invention Product 16 | Normal wear | 31 |
| Invention Product 17 | Normal wear | 33 |
| Invention Product 18 | Normal wear | 24 |
| Invention Product 19 | Normal wear | 26 |
| Invention Product 20 | Normal wear | 42 |
| Invention Product 21 | Normal wear | 40 |

TABLE 8

| | Cutting test | |
|---|---|---|
| | Damage state when processing time is 10 minutes | Processing time (minutes) |
| Comparative Product 1 | Normal wear | 14 |
| Comparative Product 2 | Chipping | 17 |
| Comparative Product 3 | Chipping | 12 |
| Comparative Product 4 | Normal wear | 16 |
| Comparative Product 5 | Normal wear | 18 |
| Comparative Product 6 | Normal wear | 20 |
| Comparative Product 7 | Normal wear | 20 |
| Comparative Product 8 | Chipping | 17 |
| Comparative Product 9 | Normal wear | 19 |
| Comparative Product 10 | Chipping | 14 |
| Comparative Product 11 | Chipping | 18 |
| Comparative Product 12 | Normal wear | 20 |
| Comparative Product 13 | Normal wear | 17 |
| Comparative Product 14 | Fracture | 8 |
| Comparative Product 15 | Chipping | 19 |
| Comparative Product 16 | Chipping | 12 |
| Comparative Product 17 | Chipping | 15 |

From the results shown in Tables 7 and 8, processing times of Invention Products were 22 minutes or longer, which were longer than processing times of all Comparative Products.

From the above results, it was found that the tool life of Invention Products were extended by improving the wear resistance and the fracture resistance.

INDUSTRIAL APPLICABILITY

Since the coated cutting tool of the invention is excellent in the wear resistance and the fracture resistance, the tool life can be extended as compared with that in the related art. Therefore, the coated cutting tool has high industrial applicability in this respect.

REFERENCE SIGNS LIST

1: substrate, 2: second layer, 3: first layer, 4: first laminated structure, 5: second laminated structure, 6: third laminated structure, 7: coating layer, 8: coated cutting tool.

What is claimed is:

1. A coated cutting tool comprising:
a substrate; and
a coating layer formed on a surface of the substrate, wherein
the coating layer has a laminated structure in which a first layer and a second layer are alternately laminated for one or more layers,
the first layer is a compound layer having a composition represented by the following formula (1):

$$Ti(C_xN_{1-x}) \quad (1)$$

(in the formula, x represents an atomic ratio of a C element to a total amount of the C element and an N element, and satisfies 0.02≤x≤0.30), the second layer is a compound layer having a composition represented by the following formula (2):

$$(Ti_yAl_{1-y})N \quad (2)$$

(in the formula, y represents an atomic ratio of a Ti element to a total amount of the Ti element and an Al element, and satisfies 0.25≤y≤0.75), the laminated structure includes a first laminated structure, a second laminated structure, and a third laminated structure in this order from a substrate side to a surface side of the coating layer, an average thickness per layer of each of the first layer and the second layer in the first laminated structure is more than 500 nm and 3000 nm or less, an average thickness per layer of each of the first layer and the second layer in the second laminated structure is more than 50 nm and 500 nm or less, an average thickness per layer of each of the first layer and the second layer in the third laminated structure is 5 nm or more and 50 nm or less, an average thickness of the first laminated structure is more than 1.0 µm and 6.0 µm or less, an average thickness of the second laminated structure is more than 0.1 µm and 2.0 µm or less, and an average thickness of the third laminated structure is 0.1 µm or more and 2.0 µm or less.

2. The coated cutting tool according to claim 1, wherein at a position 300 nm from an interface between the substrate and the coating layer toward the surface side of the coating layer, an average grain size of crystal grains forming the coating layer is 50 nm or more and 500 nm or less, and at a position 100 nm from a surface opposite to the substrate in the third laminated structure toward the substrate side, an average grain size of the crystal grains forming the coating layer is 5 nm or more and less than 50 nm.

3. The coated cutting tool according to claim 1, wherein the coating layer includes an upper layer on the surface opposite to the substrate in the third laminated structure, the upper layer is a single layer or a laminate of a compound containing at least one element selected from the group consisting of Ti, Zr, Hf, V, Nb, Ta, Cr, Mo, W, Al, Si, and Y and at least one element selected from the group consisting of C, N, O, and B (however, the compound having the composition represented by the formula (1) and the compound having the composition represented by the formula (2) are excluded), and an average thickness of the upper layer is 0.1 µm or more and 3.5 µm or less.

4. The coated cutting tool according to claim 1, wherein an average thickness of the entire coating layer is 4.0 µm or more and 12.0 µm or less.

5. The coated cutting tool according to claim 1, wherein the substrate is any one of cemented carbide, cermet, ceramics, or a cubic boron nitride sintered body.

6. The coated cutting tool according to claim 2, wherein the coating layer includes an upper layer on the surface opposite to the substrate in the third laminated structure, the upper layer is a single layer or a laminate of a compound containing at least one element selected from the group consisting of Ti, Zr, Hf, V, Nb, Ta, Cr, Mo, W, Al, Si, and Y and at least one element selected from the group consisting of C, N, O, and B (however, the compound having the composition represented by the formula (1) and the compound having the composition represented by the formula (2) are excluded), and an average thickness of the upper layer is 0.1 µm or more and 3.5 µm or less.

7. The coated cutting tool according to claim 3, wherein an average thickness of the entire coating layer is 4.0 µm or more and 12.0 µm or less.

8. The coated cutting tool according to claim 4, wherein an average thickness of the entire coating layer is 4.0 μm or more and 12.0 μm or less.

9. The coated cutting tool according to claim 5, wherein an average thickness of the entire coating layer is 4.0 μm or more and 12.0 μm or less.

10. The coated cutting tool according to claim 2, wherein the substrate is any one of cemented carbide, cermet, ceramics, or a cubic boron nitride sintered body.

11. The coated cutting tool according to claim 3, wherein the substrate is any one of cemented carbide, cermet, ceramics, or a cubic boron nitride sintered body.

12. The coated cutting tool according to claim 4, wherein the substrate is any one of cemented carbide, cermet, ceramics, or a cubic boron nitride sintered body.

13. The coated cutting tool according to claim 6, wherein the substrate is any one of cemented carbide, cermet, ceramics, or a cubic boron nitride sintered body.

14. The coated cutting tool according to claim 7, wherein the substrate is any one of cemented carbide, cermet, ceramics, or a cubic boron nitride sintered body.

15. The coated cutting tool according to claim 8, wherein the substrate is any one of cemented carbide, cermet, ceramics, or a cubic boron nitride sintered body.

16. The coated cutting tool according to claim 9, wherein the substrate is any one of cemented carbide, cermet, ceramics, or a cubic boron nitride sintered body.

* * * * *